United States Patent
Hsiao et al.

(10) Patent No.: US 8,373,474 B2
(45) Date of Patent: Feb. 12, 2013

(54) DELAY LOCK LOOP AND METHOD FOR GENERATING CLOCK SIGNAL

(75) Inventors: Chiao-Wei Hsiao, Taichung (TW); Sih-Ting Wang, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/244,621

(22) Filed: Sep. 25, 2011

(65) Prior Publication Data

US 2012/0194237 A1 Aug. 2, 2012

(30) Foreign Application Priority Data

Feb. 1, 2011 (TW) .............................. 100103982 A

(51) Int. Cl.
*H03L 7/06* (2006.01)
(52) U.S. Cl. ....................................... 327/158; 327/149
(58) Field of Classification Search .................. 327/149, 327/158
See application file for complete search history.

(56) References Cited

U.S. PATENT DOCUMENTS

| | | | |
|---|---|---|---|
| 5,969,552 A | 10/1999 | Lee et al. | |
| 6,765,976 B1* | 7/2004 | Oh | 375/376 |
| 7,916,821 B2* | 3/2011 | Li et al. | 375/373 |
| 8,106,691 B2* | 1/2012 | Sogawa et al. | 327/156 |
| 2007/0132492 A1* | 6/2007 | Chou | 327/158 |
| 2009/0045848 A1* | 2/2009 | Kiaei et al. | 327/10 |
| 2010/0295588 A1* | 11/2010 | Choi | 327/158 |
| 2011/0291720 A1* | 12/2011 | Ku | 327/158 |
| 2012/0194237 A1* | 8/2012 | Hsiao et al. | 327/157 |

* cited by examiner

*Primary Examiner* — Adam Houston
(74) *Attorney, Agent, or Firm* — Jianq Chyun IP Office

(57) ABSTRACT

A delay lock loop (DLL) including a voltage control delay line (VCDL), a phase frequency detecting loop (PFD loop), and a phase limiting loop is provided. The VCDL generates an output clock signal according to a DC voltage signal, wherein the VCDL delays an input clock signal by a specific period so as to generate the output clock signal. The PFD loop generates the DC voltage signal according to the phase difference of the input clock signal and the output clock signal and is controlled by an initiation signal. The phase limiting loop limits the delay of the output clock signal to be less than a delay time and generates the initiation signal to enable the PFD loop. Furthermore, a clock signal generating method is also provided.

18 Claims, 18 Drawing Sheets

(a)

(b)

(a)

(b)

(a)

(b)

(a)

(b)

(a)

(b)

The invention provides a delay lock loop capable of producing normally a clock signal and the erroneous phase detection is avoided.# DELAY LOCK LOOP AND METHOD FOR GENERATING CLOCK SIGNAL

CROSS-REFERENCE TO RELATED APPLICATION

This application claims the priority benefit of Taiwan application serial no. 100103982, filed on Feb. 1, 2011. The entirety of the above-mentioned patent application is hereby incorporated by reference herein and made a part of this specification.

BACKGROUND OF THE INVENTION

1. Field of the Invention

The invention relates to a signal-delaying loop and a method for generating a signal, particularly to a delay lock loop (DLL) and a method for generating a clock signal.

2. Description of Related Art

Generally speaking, digital electronic products need clock signals. However, when a clock signal propagates from one end of the electric circuitry to the other, the transmission lines cause extra delays, so the clock signal received by the receiving end is not synchronized to that at the transmitting end. Therefore, a delay lock loop (DLL) is often employed to synchronize the output clock signal and the input clock signal, in which a phase detector (PD) is required to compare the phases of the output clock signal and the input clock signal, such that a synchronized clock signal can be generated according to the obtained information.

FIG. 1 is a block diagram showing a conventional delay lock loop. Referring to FIG. 1, a delay lock loop 100 includes a voltage control delay line (VCDL) 110, a phase detector 120, a charge pump (CP) 130, and a low pass filter (LPF) 140. The signal $CLK_{ref}$ is the input clock signal of the delay lock loop 100, and the signal $CLK_{out}$ is the output clock signal of the delay lock loop 100. The output clock signal $CLK_{out}$ outputted by the delay lock loop 100 is synchronized and coherent to the input clock signal $CLK_{ref}$ of the delay lock loop 100. In the common design, the output clock signal $CLK_{out}$ of the delay lock loop 100 of lags by one period to the input clock signal $CLK_{ref}$.

FIG. 2 and FIG. 3 respectively show ideal timing diagrams of the phase detector in operation. Referring to FIGS. 1 to 3, there are two ideal conditions for the operation of the phase detector 120 herein: (1) the input clock signal $CLK_{ref}$ and the output clock signal $CLK_{out}$ both have an about 50% duty cycle; and (2) the delay time of the output clock signal $CLK_{out}$ is between 0.5 T to 1.5 T.

In FIG. 2(a), the delay time $T_{dL}$ of the output clock signal $CLK_{out}$ of the delay lock loop 100 is less than one period T. The clock signal at timing a is delayed by the delay time $T_{dL}$ after passing through the VCDL 110 and then settles at timing b. The output clock signal $CLK_{out}$ has to lag the input clock signal $CLK_{ref}$ by one period T, so the phase of the clock signal at timing b has to be compared with the phase of the clock signal at timing c. In FIG. 2(a), the clock signal at timing b leads the clock signal at timing c, so the phase detector 120 sends out a down signal with a logic high (i.e. the down signal DN=1) between the rising edge of the clock signal at timing b and the rising edge of the clock signal at timing c (i.e. the interval $T_{ph}$), so as to increase the delay of the voltage control delay line 110. Thus, in FIG. 2(b), the rising edge of the clock at timing b is aligned to the rising edge of the clock at timing c.

In FIG. 3(a) the delay time $T_{dL}$ of the output clock signal $CLK_{out}$ of the delay lock loop 100 is greater than one period T. The clock signal at timing a is delayed by $T_{dL}$ after propagating through voltage control delay line 110 and then settles at timing d. Because the output clock signal $CLK_{out}$ has to lag the input clock signal $CLK_{ref}$ by one period T, the phase of the clock signal at timing d is compared with the phase of the clock signal at timing c. In FIG. 3(a), the clock signal at timing d lags the clock signal at timing c, so the phase detector 120 respectively sends out an up signal with the logic high (i.e., the up signal UP=1) between the rising edge of the clock signal at timing a and the rising edge of the clock signal at timing b (i.e. the first interval $T_{ph}$) and between the rising edge of the clock signal at timing c and the rising edge of the clock signal at timing d (i.e. the second interval $T_{ph}$), so as to shorten the delay time of the voltage control delay line 110. Thus, in FIG. 3(b), the rising edge of the clock signal at timing d is aligned to the rising edge of the clock signal at timing c.

FIG. 4 shows a schematic logic circuit of the phase detector in FIG. 1. The phase detector 120 is composed of two D flip flops DFF1 and DFF2, of which D ends are tied to the logic high (mentioned as "1" hereafter), wherein the input signal to the two D flip flops DFF1 and DFF2 are flipped. That is, the input clock signal $CLK_{ref}$ is inputted to the CLK end of the D flip flop DFF1 and the CLR end of the D flip flop DFF2, and the output clock signal $CLK_{out}$ is inputted to the CLR end of the D flip flop DFF1 and the CLK end of the D flip flop DFF2. The D flip-flop with its D end tied to 1 operates as follows: when the end CLR=1, the D flip-flop is reset, and the end Q=0; when the end CLR=0, the CLK end changes from the logic low (mentioned as "0" hereafter) to 1, and the end Q=1.

FIG. 5 shows the timing diagram when the phase detector detects the phase difference, wherein the initial values of the up signal UP and the down signal DN are both 0. Referring to FIG. 4 and FIG. 5, at timing $T_a$, the input clock signal $CLK_{ref}$ changes from 0 to 1, the output clock signal $CLK_{out}$=0, and the up signal UP rises to the logic high; at timing $T_b$, the output clock signal $CLK_{out}$ changes from 0 to 1 to reset the D flip flop DFF1, and the up signal UP returns to the initial value 0. In the meanwhile, the input clock signal $CLK_{ref}$=1 resets the D flip flop DFF2, so the down signal DN=0.

The drawback of the conventional phase detector lies in that resetting the up signal UP and the down signal DN is determined by the input clock signal $CLK_{ref}$ or the output clock signal $CLK_{out}$ with the logic high. Thus, the logic high signal being too short or too long may cause an erroneous phase detection. For example, in FIG. 6(a), at timing $T_a$, if the output clock signal $CLK_{out}$ is not 0, the up signal UP is reset; in FIG. 6(b), at timing $T_b$, if the input clock signal $CLK_{ref}$=0, the down signal DN can not be reset. The conventional phase detector would erroneously detect the signal phase in the foregoing two situations.

Therefore it is known in the art that for a conventional phase detector to operate normally, the interval $T_{ph}$ must be sufficiently long, and the delay of the output clock signal must be 0.5 T to 1.5 T.

Furthermore, if the clock duty of the output clock signal $CLK_{out}$ generated by the delay lock loop is not good, or the clock duty of the input clock signal of the delay lock loop $CLK_{ref}$ is not good, an erroneous phase detection is caused by a conventional phase detector, and the delay lock loop can not normally operate. Because the clock duty of the clock signal varies with the processes, the power and the temperature, the delay lock loop might not be able to generate a clock signal normally due to a deteriorated clock duty.

SUMMARY OF THE INVENTION

The invention provides a delay lock loop capable of producing normally a clock signal and the erroneous phase detection is avoided.

The invention provides a method for generating a clock signal capable of producing normally a clock signal and the erroneous phase detection is avoided.

The invention provides a delay lock loop including a voltage control delay line, a phase frequency detecting loop, and a phase limiting loop. The voltage control delay line is used to receive an input clock signal and a first DC voltage signal and to generate an output clock signal according to the first DC voltage signal, wherein the voltage control delay line delays the input clock signal by a predetermined period to generate the output clock signal. The phase frequency detecting loop is used to receive the input clock signal, the output clock signal, and an initiation signal and to generate the first DC voltage signal according to a phase difference of the input clock signal and the output clock signal. The phase frequency detecting loop is controlled by the initiation signal. The phase limiting loop is used to receive the input clock signal and the output clock signal, to restrict a delay of the output clock signal to be less than a first delay time, and to generate the initiation signal to enable the phase frequency detecting loop.

In one embodiment of the invention, the voltage control delay line includes a plurality of serially connected delay cells. Each of the delay cells respectively delays the input clock signal by one clock phase.

In one embodiment of the invention, the phase frequency detecting loop includes a phase frequency detector, a first charge pump, and a first low pass filter. The phase frequency detector is used to receive the input clock signal, the output clock signal, and the initiation signal and to generate the a first up signal and a first down signal according to the phase difference of the input clock signal and the output clock signal. The phase frequency detector is controlled by the initiation signal. The first charge pump is used to receive the first up signal and the first down signal and to generate a first current signal according to the first up signal or the first down signal. The first low pass filter is used to receive the first current signal from the first charge pump to generate the first DC voltage signal.

In one embodiment of the invention, the phase limiting loop includes a phase limiter. The phase limiter is used to receive the input clock signal and the output clock signal, to generate a second up signal according to the phase difference of the input clock signal and the output clock signal to restrict the delay of the output clock signal to be less than the first delay time, and to generate the initiation signal, wherein the first charge pump further receives the second up signal and generates the first current signal according to the first up signal, the first down signal, or the second up signal.

In one embodiment of the invention, the phase limiter further generates a second down signal according to the phase difference of the input clock signal and the output clock signal to restrict the delay of the output clock signal to be greater than a second delay time, wherein the first charge pump further receives the second down signal and generates the first current signal according to the first up signal, the first down signal and the second up signal, or the second down signal.

In one embodiment of the invention, the phase limiting loop includes a phase limiter, a second charge pump, and a second low pass filter. The phase limiter is used to receive the input clock signal and the output signal and to generate a second up signal according to the phase difference of the input clock signal and the output clock signal. The second charge pump is used to receive the second up signal and to generate a second current signal according to the second up signal. The second low pass filter is used to receive the second current signal from the second charge pump and to generate a second DC voltage signal, wherein the phase limiter restricts the delay of the output clock signal to be less than the first delay time by the second DC voltage signal.

In one embodiment of the invention, The phase limiter generates further a second down signal according to the phase difference of the input clock signal and the output clock signal to restrict the delay of the output clock signal to be greater than a second delay time, wherein the second charge pump further receives the second down signal and generates the second current signal according to the second up signal or the second down signal, and the phase limiter restricts the output clock signal to be greater than the second delay time by the second DC voltage signal.

In one embodiment of the invention, the phase limiter includes a frequency divider, a logic signal generation unit and an initiation signal generation unit. The frequency divider is used to receive the input clock signal and to divide the input clock signal to generate the divided input clock signal. The logic signal generation unit is used to receive the divided input clock signal and the clock phase outputted by N delay cells in order to output a logic high signal. The initiation signal generation unit is used to receive the input clock signal, the clock phase, and the logic high signal outputted by the $M^{th}$ delay cell, to output the logic high signal as the second up signal according to the input clock signal and the clock phase outputted by the $M^{th}$ delay cell, and to output the initiation signal to enable the phase frequency detecting loop, wherein M and N are both positive integers.

In one embodiment of the invention, the voltage control delay line includes L delay cells connected in series, wherein L, M, and N satisfy the following conditions: M<N and L−N<M<L, L is a positive integer, and L is greater than M and N.

The invention provides a method for generating a clock signal, which is adapted to a delay lock loop. A delay lock loop delays an input clock signal by a predetermined period to generate an output clock signal. The method for generating the clock signal includes the following steps. The delay of the output clock signal is restricted to be less than a first delay time, and an initial value is generated. A first DC voltage signal is generated according to the initiation signal and the phase difference between the input clock signal and the output clock signal. The input clock signal is delayed by a predetermined period to generate the output clock signal according to the first DC voltage signal.

In one embodiment of the invention, the step of generating the first DC voltage signal includes the following steps. A first up signal or a first down signal is generated according to the initiation signal and the phase difference between the input clock signal and the output clock signal. A first current signal is generated according to the first up signal or the first down signal. The first DC voltage signal is generated according to the first current signal.

In one embodiment of the invention, the step of restricting the delay of the output clock signal to be less than the first delay time includes the following step. A second up signal is generated according to the phase difference between the input clock signal and the output clock signal to restrict the delay of the output clock signal to be less than the first delay time. Herein, in the step of generating the first current signal, the first current signal is generated according to the first up signal, the first down signal, or the second up signal.

In one embodiment of the invention, the method for generating the clock signal further includes the step of restricting the delay of the output clock signal to be greater than a second delay time.

In one embodiment of the invention, the step of restricting the delay of the output clock signal to be greater than the second delay time includes the following step. A second down signal is generated according to the phase difference between the input clock signal and the output clock signal to restrict the delay of the output clock signal to be greater than the second delay time. Herein in the step of generating the first current signal, the first current signal is generated according to the first up signal, the first down signal, the second up signal, or the second down signal.

In one embodiment of the invention, the step of restricting the delay of the output clock signal to be less than the first delay time includes the following steps. A second up is generated signal according to the phase difference between the input clock signal and the output clock signal. A second current signal is generated according to the second up signal. A second DC voltage signal is generated according to the second current signal. Herein in the step of restricting the delay of the output clock signal to be less than the first delay time, the delay of the output clock signal is restricted to be less than the first delay time by the second DC voltage signal.

In one embodiment of the invention, the step of restricting the delay of the output clock signal to be greater than the second delay time includes the following step. A second down signal is generated according to the phase difference between the input clock signal and the output clock signal to restrict the delay of the output clock signal to be greater than the second delay time. Herein in the step of generating the second current signal, the second current signal is generated according to the second up signal or the second down signal, and in the step of restricting the delay of the output clock signal to be greater than the second delay time, the delay of the output clock signal is restricted to be greater than the second delay time by the second DC voltage signal.

According to the above descriptions, in an exemplary embodiment of the invention, the phase limiting loop can control the initial state of the phase frequency detecting loop such that the phase detection can be performed at appropriate timing, and the erroneous phase detection of the phase frequency detecting loop, due to a poor duty cycle of the output clock signal generated by the delay lock loop, can be avoided.

In order to make the aforementioned and other objects, features and advantages of the disclosure comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In an exemplary embodiment of the invention, the phase frequency detecting loop adopts a phase frequency detector commonly used in a phase lock loop. The phase frequency detector determines the phase relation between two signals based on signal edges, such that the duty cycle of the input signal does not affect the detection result of the phase frequency detector.

Figure 1:
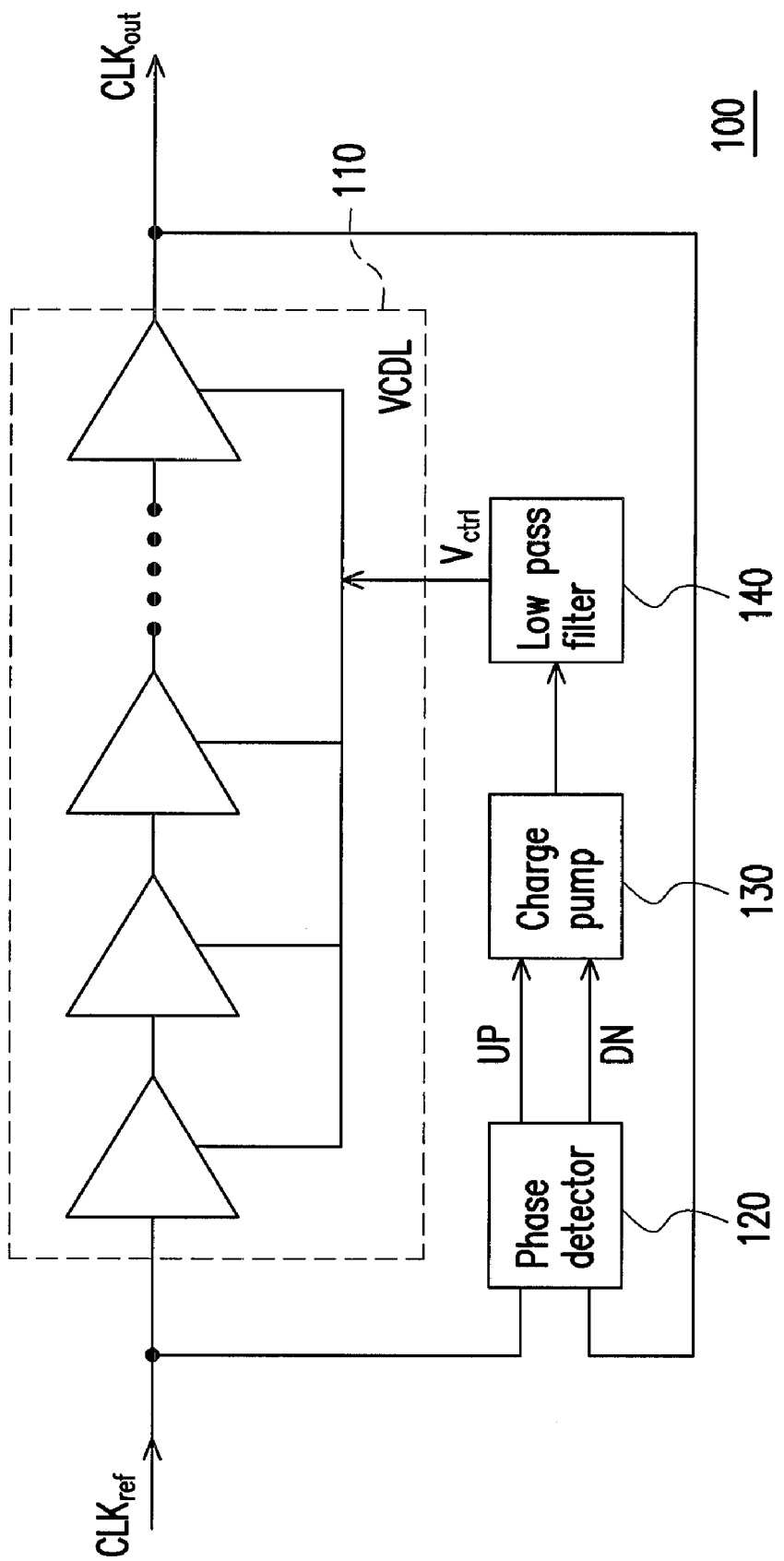
FIG. 1 is a block diagram showing a conventional delay lock loop.
Figure 2:
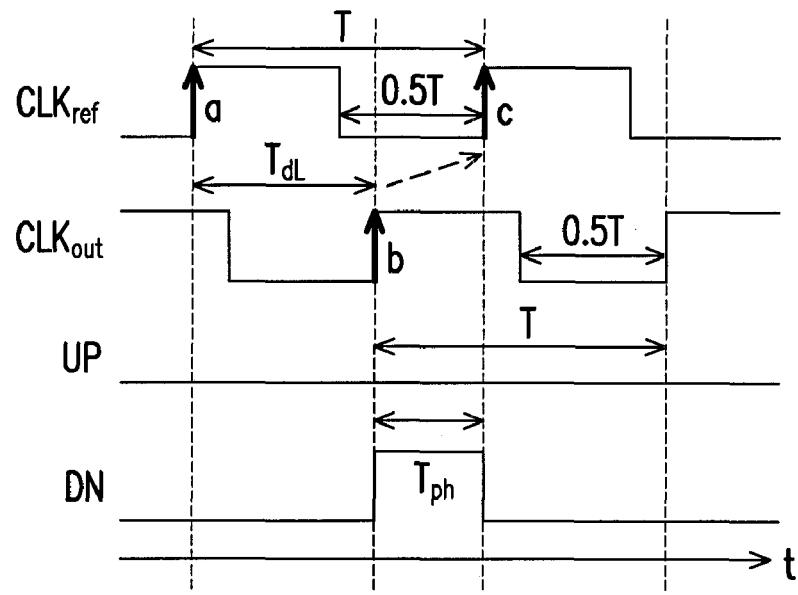
FIG. 2 and FIG. 3 respectively show ideal timing diagrams of the phase detector in operation.
Figure 2:
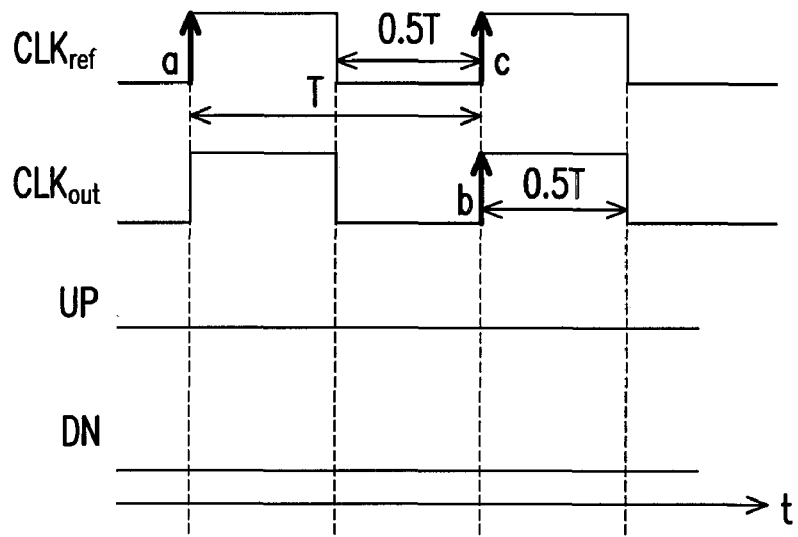
Figure 3:
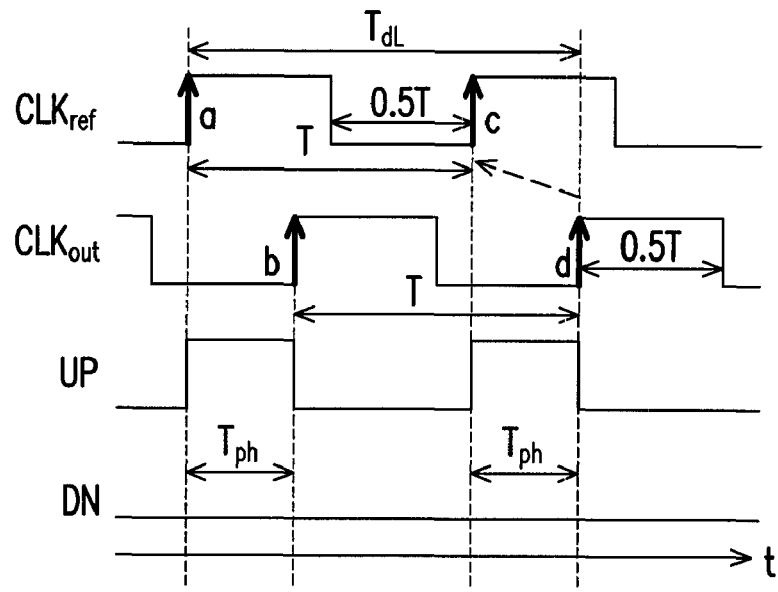
Figure 3:
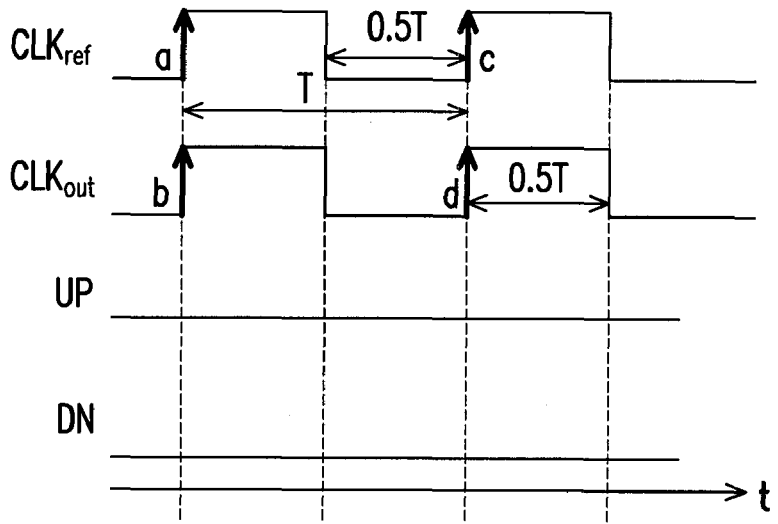
Figure 4:
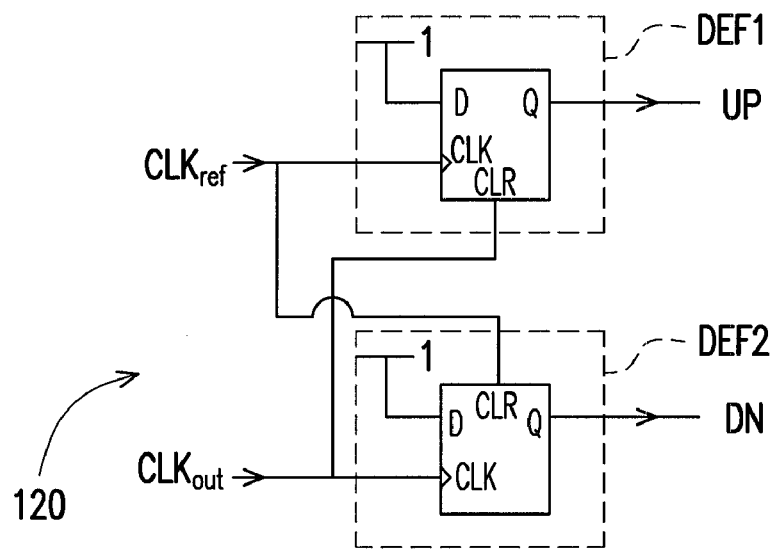
FIG. 4 shows a schematic logic circuit of the phase detector in FIG. 1.
Figure 5:
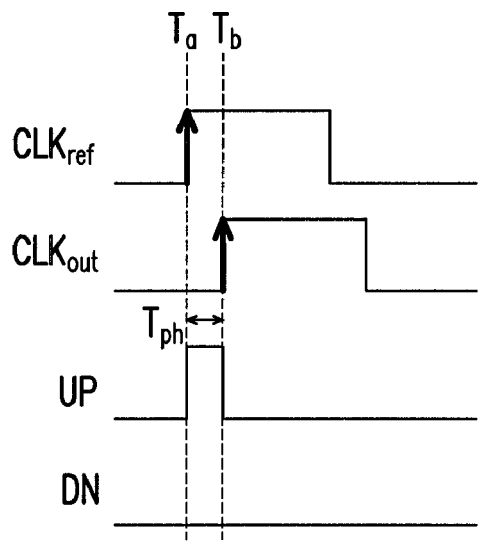
FIG. 5 shows the timing diagram when the phase detector detects the phase difference.
Figure 6:
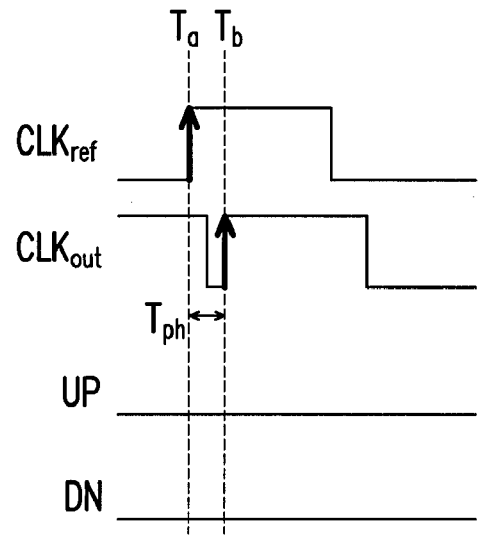
FIG. 6 shows the up signal and the down signal of the phase detector being reset in different states.
Figure 6:
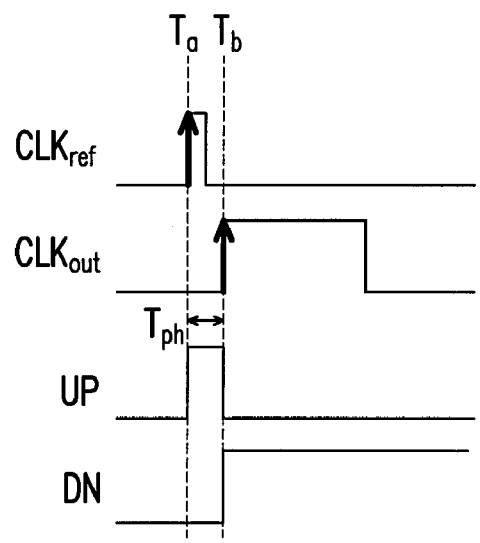
Figure 7:
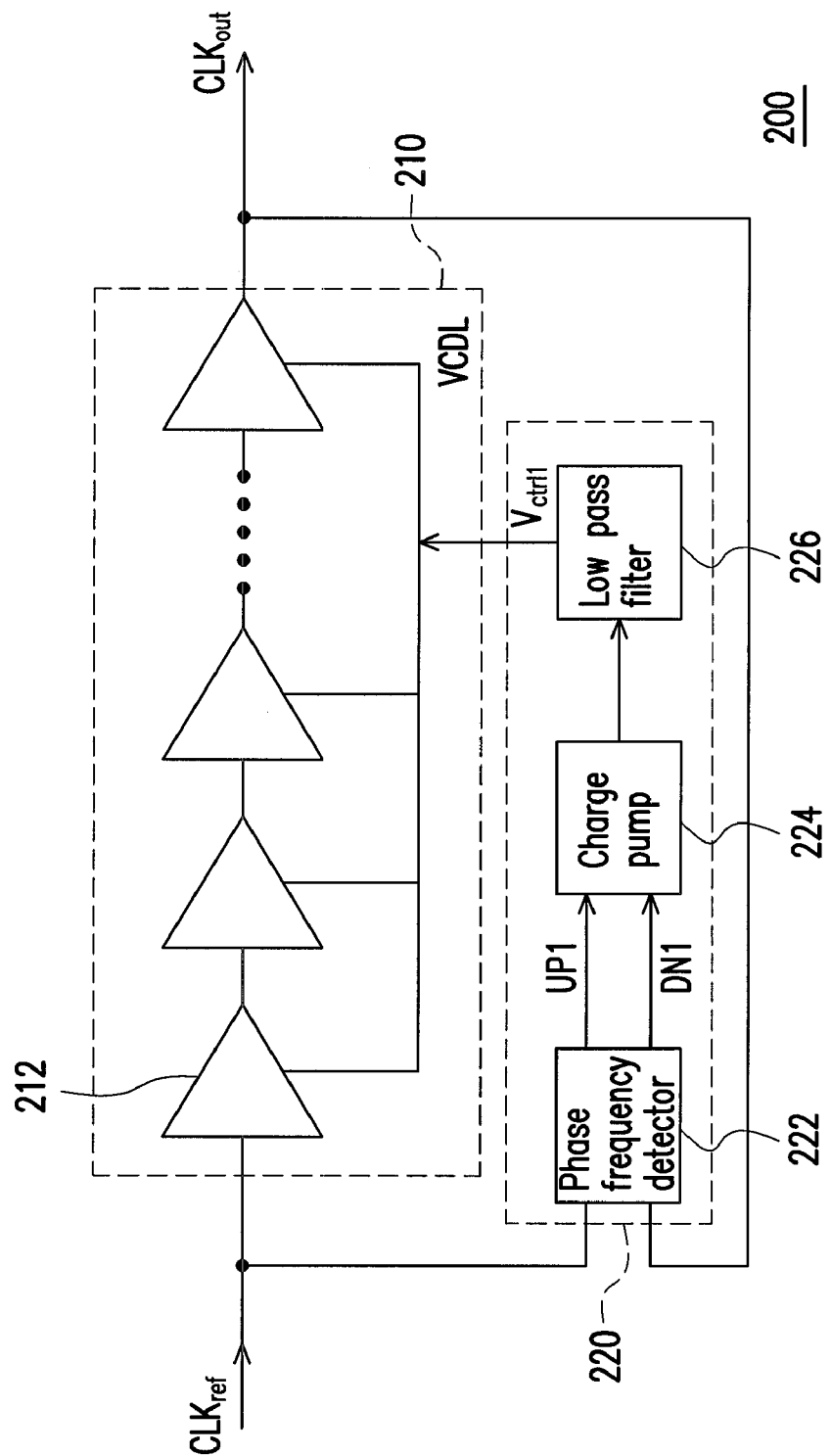
FIG. 7 illustrates a delay lock loop according to an embodiment of the invention.

FIG. 7 illustrates a delay lock loop according to an embodiment of the invention. Referring to FIG. 7, in present embodiment, a delay lock loop 200 includes a voltage control delay line 210, a phase frequency detector 222, a charge pump 224, and a low pass filter 226. Herein, the delay lock loop 200, for example, delays the input clock signal $CLK_{ref}$ by a predetermined period T to generate an output clock signal $CLK_{out}$.

Specifically, the voltage control delay line 210 includes a plurality of delay cells 212 coupled in series. Each of the delay cells 212 respectively delays the input clock signal $CLK_{ref}$ by one clock phase $T_d$. Therefore, taking the 16 serial delay cells 212 for instance, the predetermined period T is 16 times of $T_d$, i.e. $T=16T_d$.

In the present embodiment, the phase frequency detector 222, the charge pump 224, and the low pass filter 226, for example, forms a phase frequency detector 220. In other words, the delay lock loop 200 in the present embodiment, for example, includes the voltage control delay line 210 and the phase frequency detecting loop 220.

The phase frequency detector 222 is used to receive the input clock signal $CLK_{ref}$ and the output clock signal $CLK_{out}$ fed back from the voltage control delay line 210. Furthermore, the phase frequency detector 222 generates an up signal UP1 or a down signal DN1 according to the input clock signal $CLK_{ref}$ and the output clock signal $CLK_{out}$. The charge pump 224 is used to receive the up signal UP1 and the down signal DN1 and generates a current signal (not shown) according to the up signal UP1 or the down signal DN1. The low pass filter 226 is used to receive the current signal from the charge pump 224 to generate a DC voltage signal $V_{ctrl1}$.

Accordingly, the voltage control delay line 210 delays the input clock signal $CLK_{ref}$ by a predetermined period T according to the DC voltage signal $V_{ctrl1}$ to generate the output clock signal $CLK_{out}$.

Figure 8:
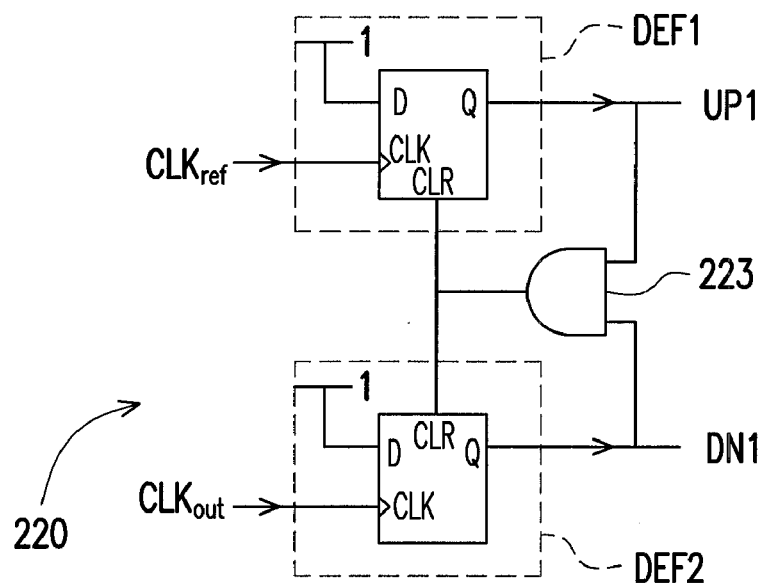
FIG. 8 shows the logic circuit diagram of the phase detector shown in FIG. 7.

FIG. 8 shows the logic circuit diagram of the phase detector shown in FIG. 7. Referring to FIG. 8, in the present embodiment, the phase frequency detector 222 includes two D flip flops DFF1 and DFF2 and an AND gate 223. The D ends of the D flip flops DFF1 and DFF2 are coupled to the logic high (mentioned as "1" hereafter).

In the present embodiment, the input clock signal $CLK_{ref}$ is inputted to the CLK end of the D flip flop DFF1, and the output clock signal $CLK_{out}$ is inputted to the CLK end of the D flip flop DFF2. The CLR ends of the D flip flops DFF1 and DFF2 are coupled to each other and controlled by the AND result of the up signal UP1 and the down signal DN1. The D flip flop with its D end tied to 1 operated as follows: when the end CLR=1, the D flip flop is reset, and the end Q=0; when the end CLR=0, the CLK end changes from the logic low (mentioned as "0" hereafter) to 1, and the end Q=1.

Figure 9:
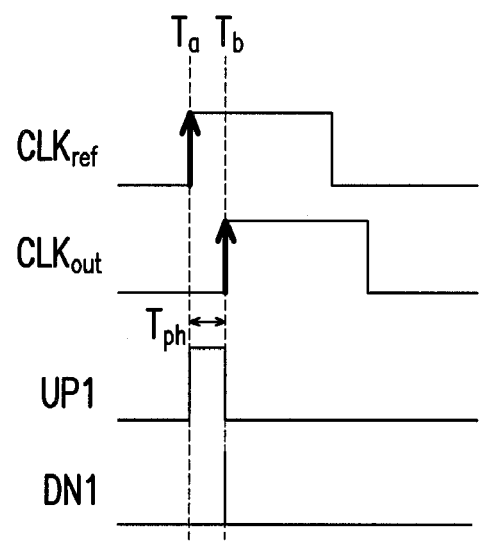
FIG. 9 shows the timing diagram when the phase detector detects the phase difference.

FIG. 9 shows the timing diagram when the phase detector detects the phase difference. The initial values of the up signal UP and the down signal DN are both 0. Referring to FIG. 8 and FIG. 9, at timing $T_a$, the input clock signal $CLK_{ref}$ changes from 0 to 1, the output clock signal $CLK_{out}$=0, and the up signal UP1 is a signal with the logic high in the meanwhile; at timing $T_b$, the output clock signal $CLK_{out}$ changes from 0 to 1, and the down signal DN1 is a signal with the logic high in the meanwhile. The up signal UP1 and the down signal DN1 are both the signal with the logic high, so the D flip flops are reset in next period, and the up signal UP1 and the down signal DN1 are reset to 0.

Figure 10:
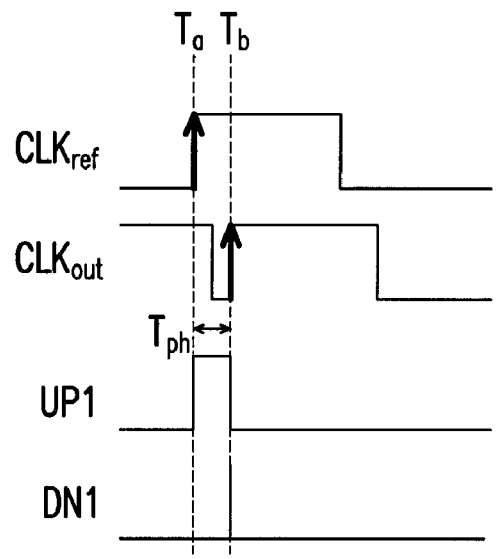
FIG. 10 shows the up signal and the signal of the phase frequency detector being reset in different states according to an embodiment of the invention.
Figure 10:
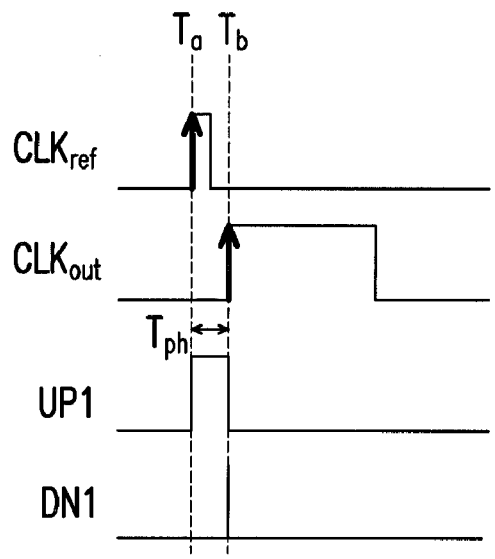

Thus, a phase frequency detector determines the phase relation between two signals based on signal edges, so the duty cycles of the input signals do not affect the detection result of the phase frequency detector. For example, in FIG. 10(a) and FIG. 10(b), the phase frequency detector can detect the phase difference of the clock signals regardless of the clock duty of the clock signals. In other words, in the present embodiment, compared with the conventional phase detector, the phase frequency detector is able to normally operate even if the interval $T_{ph}$ is short.

Figure 11:
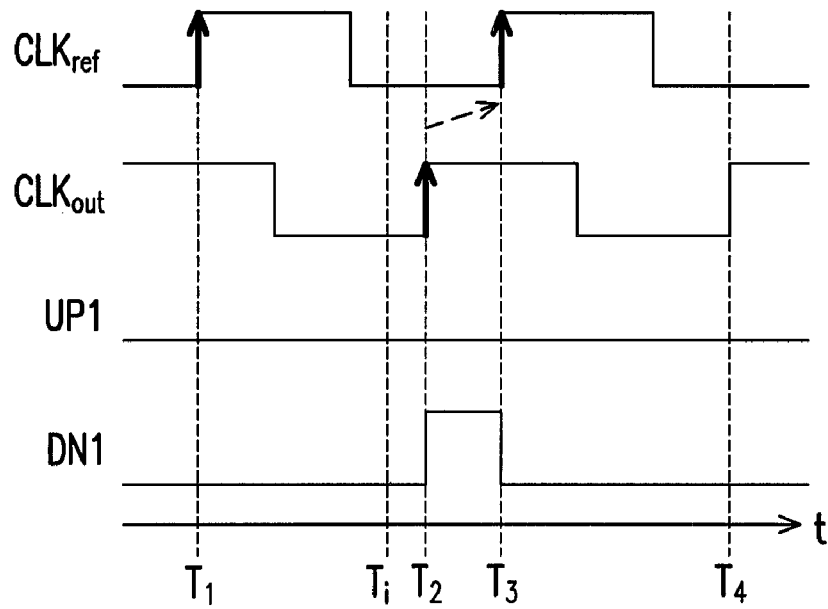
FIG. 11 shows the timing diagram when the phase frequency detector detects the phase difference in different initial states.
Figure 11:
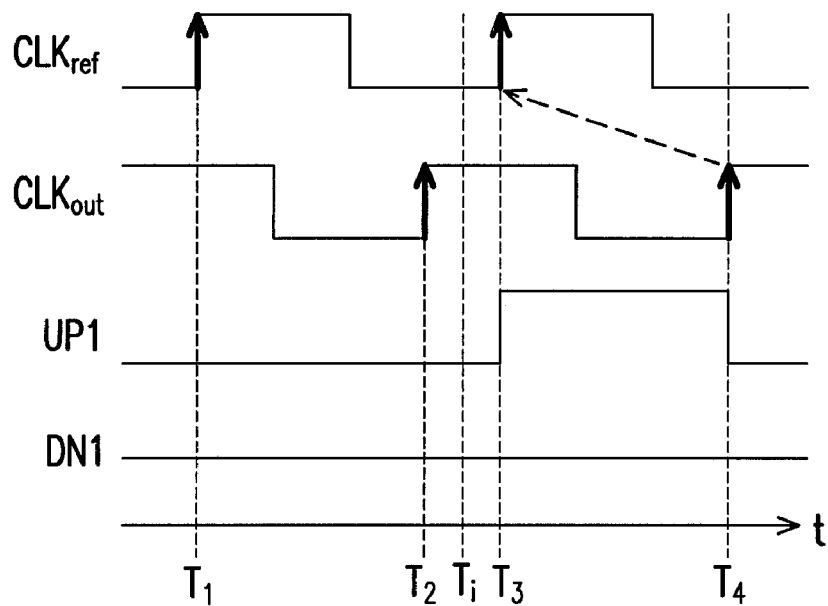

FIG. 11 shows the timing diagram when the phase frequency detector detects the phase difference in different initial states. Referring to FIG. 7 and FIG. 11, in the present embodiment, the output clock signal $CLK_{out}$ is a clock signal generated by the voltage control delay line 210 by delaying the input clock signal $CLK_{ref}$. The arrow of the output clock signal $CLK_{out}$ at the timing $T_2$ leads the arrow of the input clock signal $CLK_{ref}$ at the timing $T_3$.

FIG. 11 illustrates two initial states of the phase frequency detector 222. In FIG. 11(a), the initial state $T_i$ of the phase frequency detector 222 is before the timings $T_2$ and $T_3$, such that the phase frequency detector 222 can detect the incident that the output clock signal $CLK_{out}$ leads the input clock signal $CLK_{ref}$, and further, generates the down signal DN1 between the timings $T_2$ and $T_3$.

In FIG. 11(b), the initial state $T_i$ of the phase frequency detector 222 is between the timings $T_2$ and $T_3$, such that the phase frequency detector 222 can not detect the output clock signal $CLK_{out}$ at the timing $T_2$, and instead, it detects the phase difference between the output clock signal $CLK_{out}$ at the timing $T_4$ and the input clock signal $CLK_{ref}$ at the timing $T_3$.

Therefore, in the exemplary embodiments of the invention, the delay lock loop can further include a phase limiting loop to control the initial states of the phase frequency detecting loop such that the phase detection can be performed at appropriate timings, and an erroneous phase detection of the phase frequency detecting loop, due to a poor duty cycle of the output clock signal generated by the delay lock loop, can be avoided.

Figure 12:
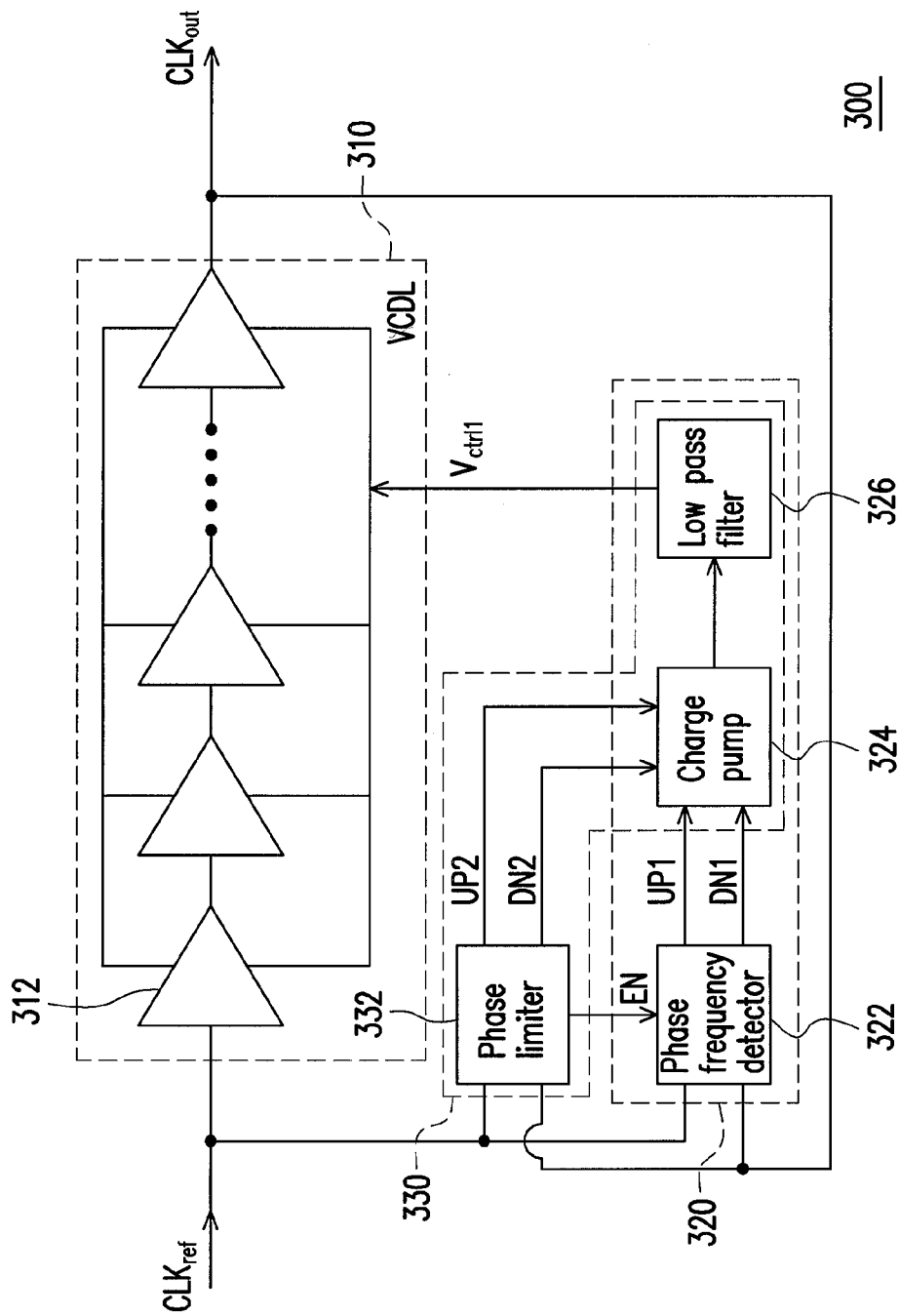
FIG. 12 illustrates a delay lock loop according to an embodiment of the invention.

FIG. 12 illustrates a delay lock loop according to an embodiment of the invention. Referring to FIG. 12, in the present embodiment, a delay lock loop 300 includes a voltage control delay line 310, a phase frequency detecting loop 320, and a phase limiting loop 330. The phase frequency detecting loop 320 includes a phase frequency detector 322, a charge pump 324, and a low pass filter 326. The phase limiting loop 330 includes a phase limiter 332, the charge pump 324, and the low pass filter 326. Generally, a phase limiting loop must have a charge pump and a low pass filter, and thus in the present embodiment, the charge pump and the low pass filter of the phase limiting loop 330 can be shared with the phase frequency detecting loop 320, but the invention is not limited thereto.

In more detail, the voltage control delay line 310 is used to receive the input clock signal $CLK_{ref}$ and the DC voltage signal $V_{ctrl1}$ and to generate the output clock signal $CLK_{out}$ according to the DC voltage signal $V_{ctrl1}$, wherein the voltage control delay line 310 delays the input clock signal $CLK_{ref}$ by a predetermined period T to generate the output clock signal $CLK_{out}$.

The phase frequency detecting loop 320 is used to receive the input clock signal $CLK_{ref}$, the output clock signal $CLK_{out}$, and an initiation signal EN. Herein, the output clock signal $CLK_{out}$ is fed back from the output end of the voltage control delay line 310. Subsequently, the phase frequency detecting loop 320 generates the DC voltage signal $V_{ctrl1}$ according to the phase difference between the input clock signal $CLK_{ref}$ and the output clock signal $CLK_{out}$ and is controlled by the initiation signal EN. In other words, the phase detecting loop 320 simply performs the phase detection after being enabled by the initiation signal EN.

The phase limiting loop 330 is used to receive the input clock signal $CLK_{ref}$ and the output clock signal $CLK_{out}$, to restrict the delay of the output clock signal $CLK_{out}$ to be less than a delay time $T_{dL1}$, and to generate the initiation signal EN to enable the phase frequency detecting loop 320. In other words, the phase limiting loop 330 can control the initial state of the phase frequency detecting loop 320 and enable the phase frequency detecting loop 320 at appropriate timings such that the erroneous phase detection can be avoided.

To be specific, the voltage control delay line 310, for example, includes a plurality of delay cells 312 connected in series. Each of the delay cells 312 respectively delays the input clock signal $CLK_{ref}$ by one clock phase $T_d$. Therefore, taking 16 delay cells 312 connected in series for instance, the predetermined T is 16 times of $T_d$, i.e. $T=16T_d$, but the invention is not limited thereto.

Furthermore, in the phase frequency detecting loop 320, the phase frequency detector 322 is used to receive the input clock signal $CLK_{ref}$, the output clock signal $CLK_{out}$, and the initiation signal EN, and to generate the up signal UP1 or the down signal DN1 according to the phase difference between the input clock signal $CLK_{ref}$ and the output clock signal $CLK_{out}$, and the phase frequency detector 322 is controlled by the initiation signal EN. The charge pump 324 is used to receive the up signal UP1 or the down signal DN1 and to generate a current signal (not shown) according to the up signal UP1 or the down signal DN1. The low pass filter 326 is used to receive the current signal from the charge pump 324 to generate the DC signal $V_{ctrl1}$.

In the phase limiting loop 330, the phase limiter 332 is used to receive the input clock signal $CLK_{ref}$ and the output clock signal $CLK_{out}$ and to generate an up signal UP2 according to the phase difference between the input clock signal $CLK_{ref}$ and the output clock signal $CLK_{out}$, such that the delay of the output clock signal $CLK_{out}$ is restricted to be less than the delay time $T_{dL1}$, and thereby an initiation signal EN is generated. In other words, the phase limiting loop 330 of the present embodiment enables the phase frequency detecting loop 320 through the initiation signal EN.

In the present embodiment, the phase limiting loop 330, for example, restricts the delay of the output clock signal $CLK_{out}$ to be less than twice of the predetermined period T, i.e. $T_{dL1}=2$ T, to enable the phase frequency detecting loop 320 of the present embodiment to perform the correct phase detection at appropriate timings. Thus, in the present embodiment, the charge pump 324 further receives the up signal UP2 and generates the current signal according to the up signal UP1, the down signal DN1, or the up signal UP2. In other words, the phase limiting loop 330 of the present embodiment restricts the delay of the output clock signal $CLK_{out}$ to be less than the delay time $T_{dL1}$ through the up signal UP2 and the DC voltage signal $V_{ctrl1}$.

It should be noted that the phase limiter 332 of the present embodiment restricts the delay of the output clock signal $CLK_{out}$ to be less than the delay time $T_{dL1}$ to avoid the phase frequency detecting loop 320 performing the erroneous phase detection. However, to provide the delay lock loop 300 with better electrical characteristics, the phase limiter 332 of the present embodiment can further restrict the delay of the output clock signal $CLK_{out}$ to be greater than a delay time $Td_{L2}$, but the invention is not limited thereto.

In other words, in the phase limiting loop 330, the phase limiter 332 further generates a down signal DN2 according to the phase difference between the input clock signal $CLK_{ref}$ and the output clock signal $CLK_{out}$ to restrict the delay of the output clock signal $CLK_{out}$ to be greater than the delay time $T_{dL2}$. Accordingly, in the present embodiment, the charge pump 324 further receives the down signal DN2 and generates the current signal according to the up signal UP1, the down signal DN1, the up signal UP2, or the down signal DN2.

Thus, in the present embodiment, the phase limiter 332, for example, restricts the delay of the output clock signal $CLK_{out}$ to be between the delay time $T_{dL1}$ and $T_{dL2}$, so as to enable the phase frequency detecting loop 320 to perform the correct phase detection and provide the delay lock loop 300 with better electrical characteristics. However, even if the phase limiter 332 of the present embodiment simply restricts the output clock signal $CLK_{out}$ to be less than the delay time $T_{dL1}$, the delay lock loop 300 still can normally operate.

A plurality of embodiments are provided in the following to illustrate the timing relations between the signals in the delay lock loop when the phase limiting loop restricts the delay of the output clock signal.

Figure 13:
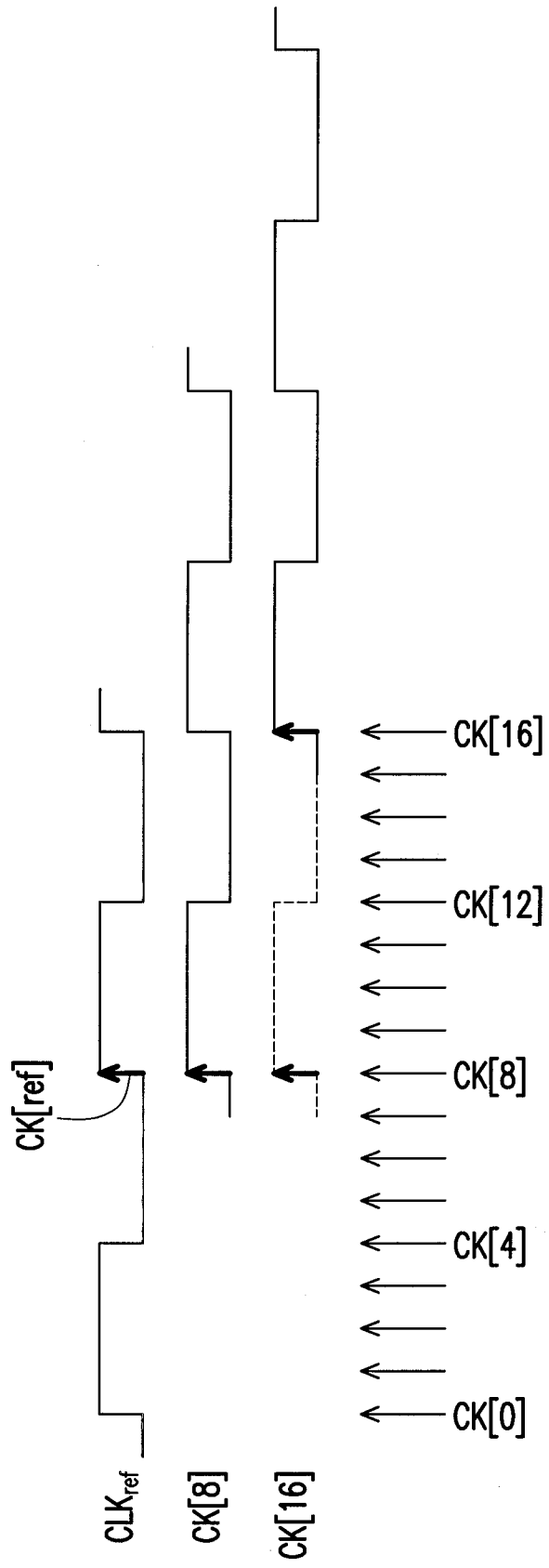
FIG. 13 shows the timing relation between the signals of the delay lock loop.
Figure 14:
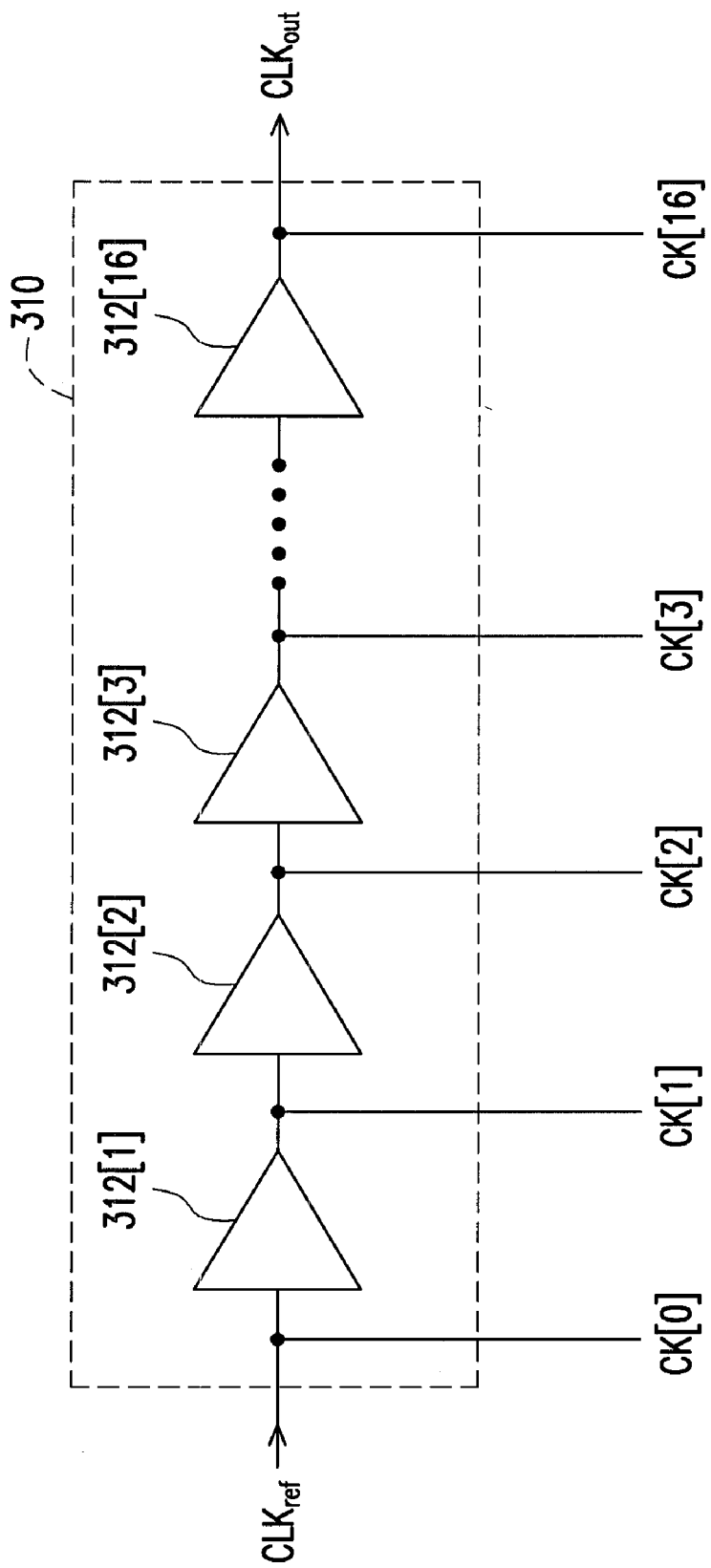
FIG. 14 shows the clock phases outputted by each of the delay cells of the voltage control delay line of FIG. 12.

FIG. 13 shows the timing relation between the signals of the delay lock loop. FIG. 14 shows the clock phases outputted by each of the delay cells of the voltage control delay line of FIG. 12.

Referring to FIGS. 12 to 14, in FIG. 12, the voltage control delay line 310 including 16 delay cells 312 connected in series is exemplary, such that if each of the delay cells respectively delays the input clock signal $CLK_{ref}$ by one clock phase $T_d$, the predetermined delay time T delayed by the voltage control delay line is 16 times of the clock phase $T_d$, i.e. $T=16T_d$, wherein the clock phase $T_d$ is a delay time of one phase.

In FIG. 14, the clock phase CK[1] outputted by the $1^{st}$ delay cell 312[1], for example, is the input clock signal $CLK_{ref}$ delayed by one clock phase $T_d$; the clock phase CK[2] outputted by the $2^{nd}$ delay cell 312[2], for example, is the input clock signal $CLK_{ref}$ further delayed by one clock phase $T_d$; and so on. Herein, the non-delayed clock phase CK[0] is the input clock signal $CLK_{ref}$. Thus, in the present embodiment, the function of the delay lock loop 300 is to synchronize the clock phase CK[16] outputted by the $16^{th}$ delay cell 312[16], i.e. the output clock signal $CLK_{out}$, to the reference clock.

For example, in FIG. 13, assume that the clock phase CK[16] is delayed by almost two predetermined period 2 T, and thus the objective of the delay lock loop 300 is to synchronize the clock phase CK[16] with the reference phase CK[ref]. However, the clock phase CK[16] and the reference phase CK[ref] differ by one predetermined period T, such that the phase frequency detecting loop 320 fails to detect a correct timing relation therebetween. Consequently, one of the functions of the phase limiting loop 330 is to restrict the delay time of the voltage control delay line 310 to be less than two predetermined period 2 T. That is to say, the phase limiter 332 must restrict the delay of the output clock signal $CLK_{out}$ to be less than the delay time 2 T, i.e. $T_{dL1}=2$ T.

Thus, if the delay time of the voltage control delay line 310 is less than the predetermined period 2 T, the delay lock loop 300 in conjunction with the phase frequency detecting loop 320 can synchronize the reference phase CK[ref] and the clock phase CK[16].

Figure 15:
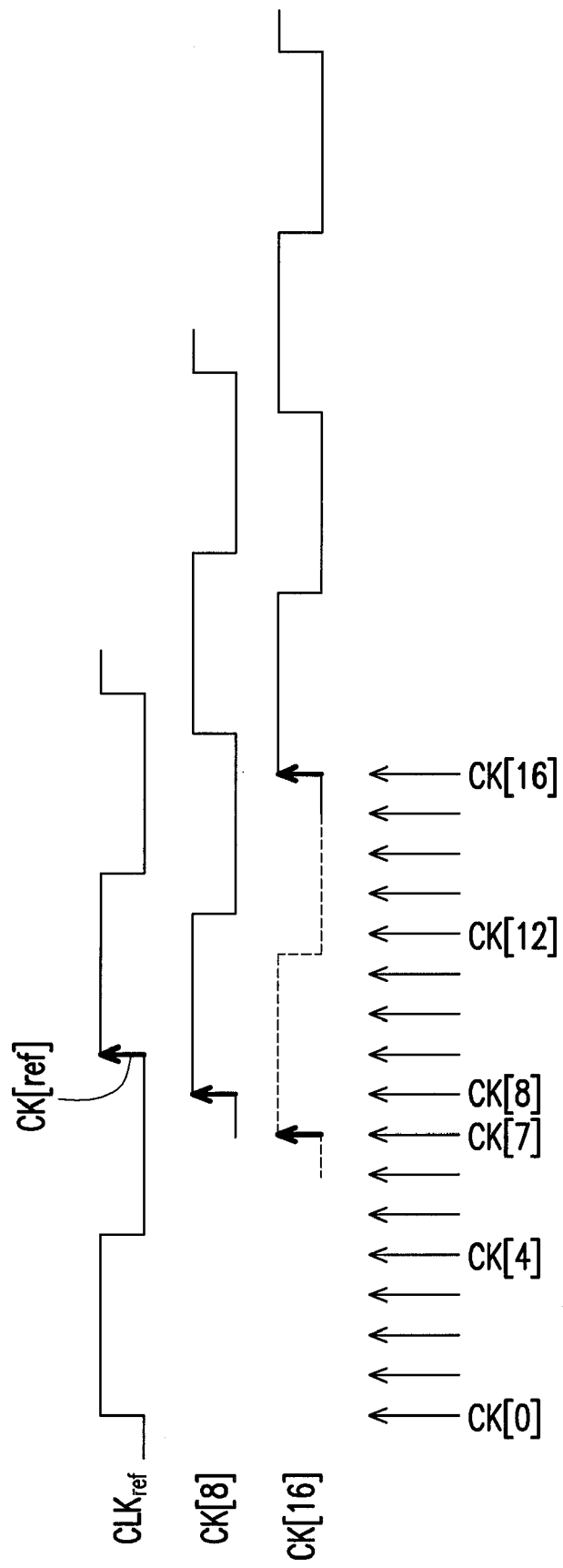
FIG. 15 shows another timing relation between the signals of the delay lock loop.

FIG. 15 shows another timing relation between the signals of the delay lock loop. Referring to FIGS. 12 to 15, if the initial state of the phase frequency detecting loop 320 is synchronized with the clock phase between the clock phase CK[7] and the reference phase CK[ref] (e.g. the clock phase CK[8]), the phases of the reference phase CK[ref] and the clock phase CK[16] can be locked by the delay lock loop 300 in conjunction with the phase frequency detecting loop 320.

Therefore, in the exemplary embodiments of the invention, the phase limiter 332, for example, restricts the delay of the output clock signal $CLK_{out}$ to be less than the delay time $T_{dL1}$, such that the phase frequency detecting loop 320 can perform the correct phase detection.

Figure 16:
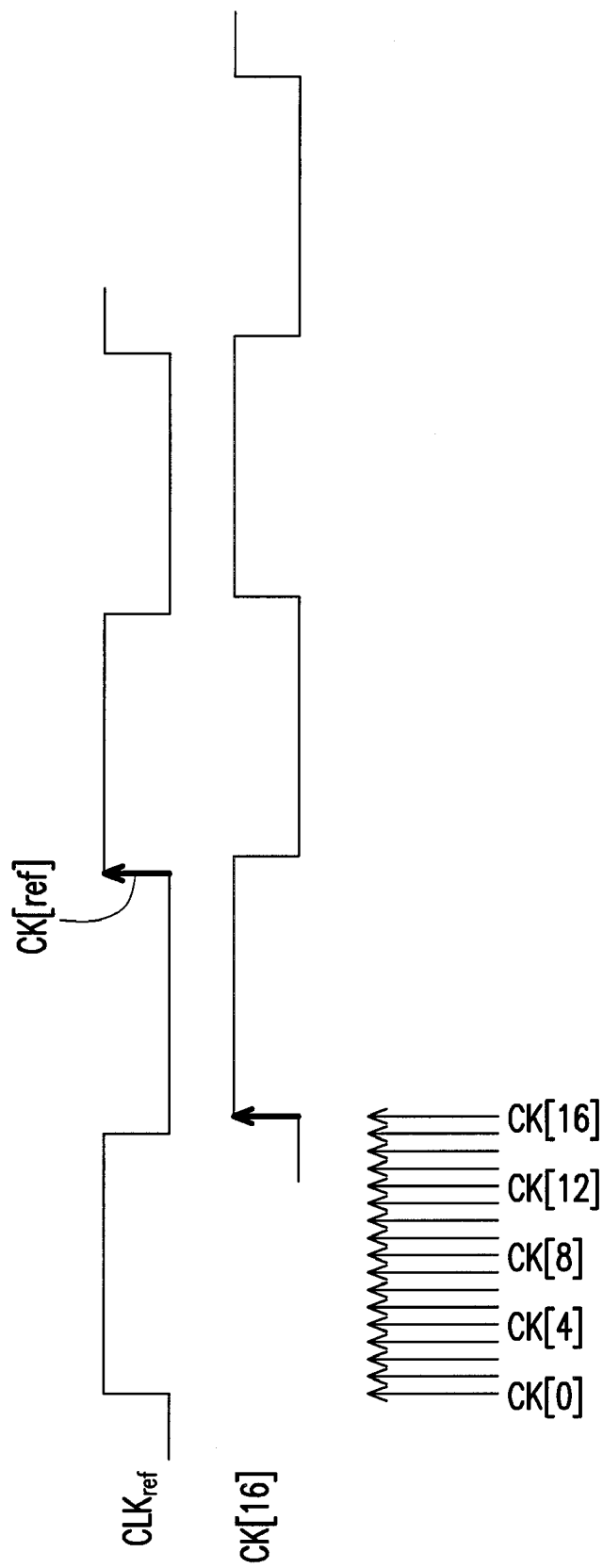
FIG. 16 shows another timing relation between the signals of the delay lock loop.

FIG. 16 shows another timing relation between the signals of the delay lock loop. Referring to FIGS. 12 to 16, in FIG. 16, assume the clock phase CK[16] is less than a predetermined period T, and thus any clock phase less than the clock phase CK[16] can serve as the initial state of the phase frequency detecting loop 320, such that the correct synchronization can be performed.

Therefore, in the exemplary embodiments of the invention, the phase limiter 332, for example, does not have to restrict the delay of the output clock signal $CLK_{out}$ to be greater than the delay time $T_{dL2}$, such that the phase frequency detecting loop 320 can correctly perform the phase detection.

As known from FIGS. 13 and 16, to enable the phase frequency detecting loop to correctly perform the phase detection, the phase limiting loop must restrict the delay of the output clock signal $CLK_{out}$ to be less than the delay time $T_{dL1}$. To be specific, if the phase limiting loop further restricts the delay of the output clock signal $CLK_{out}$ to be greater than the delay time $T_{dL2}$, the delay lock loop can provide better electrical characteristics.

In FIG. 15, assume the initial state to be synchronized with the $M^{th}$ clock phase CK[m] for the phase frequency detecting loop 320 to normally operate is necessary, and thus $$m \times T_d < T; \text{ and} \tag{1}$$

$$(T_d \times 16) - T < m \times T_d < T_d \times 16. \tag{2}$$

Herein, m is a positive integer. When the condition (1) is satisfied, the initial state of the phase frequency detecting loop 320 is ensured to be at the rising edge of which the reference phase CK[ref] is delayed by one predetermined period T.

Furthermore, as known from FIG. 15, the clock phase $T_d$ can not be greater than T/8. Thus, to obtain a good phase for initial synchronization, the maximum clock phase $T_d$ is T/9.

When $T_d$=T/9, the foregoing conditions are changed consequently as follows:

$$m \times T/9 < T; \text{ and} \quad (1)$$

$$[(T/9) \times 16] - T < m \times (T/9) < (T/9) \times 16 \Rightarrow 16 > m > 7 \quad (2)$$

Thus, based on the foregoing conditions, when $T_d$=T/9, m=8.

Therefore, in the present embodiment, the phase limiting loop 330 simply has to restrict the delay of the clock phase CK[9] from the reference phase CK[ref] by less than a specific period T, such that the phase frequency detecting loop 320 can correctly perform the phase detection.

It should be noted that in the present embodiment, if gate delays and mismatches are taken into account, more alternatives are added to the foregoing conditions. For example, the phase limiter 332 can select a phase from the clock phase CK[9]~CK[16], or even a longer phase delay, to restrict the delay of the voltage control delay line 310, such that a correct phase is further determined to synchronize the initial state of the phase frequency detecting loop 320.

Assume the phase determined by the phase limiter 332, for example, is CK[n], then $T_d$=T/n, wherein n is a positive integer. The foregoing conditions are further changed consequently as follows:

$$m \times T/n < T; \text{ and} \quad (1)$$

$$[(T/n) \times 16] - T < m \times (T/n) < (T/n) \times 16 \quad (2)$$

$$\Rightarrow 16 - n \leq m \leq 16,$$

wherein n has to be greater than 8, or there is no solution for m.

Figure 17:
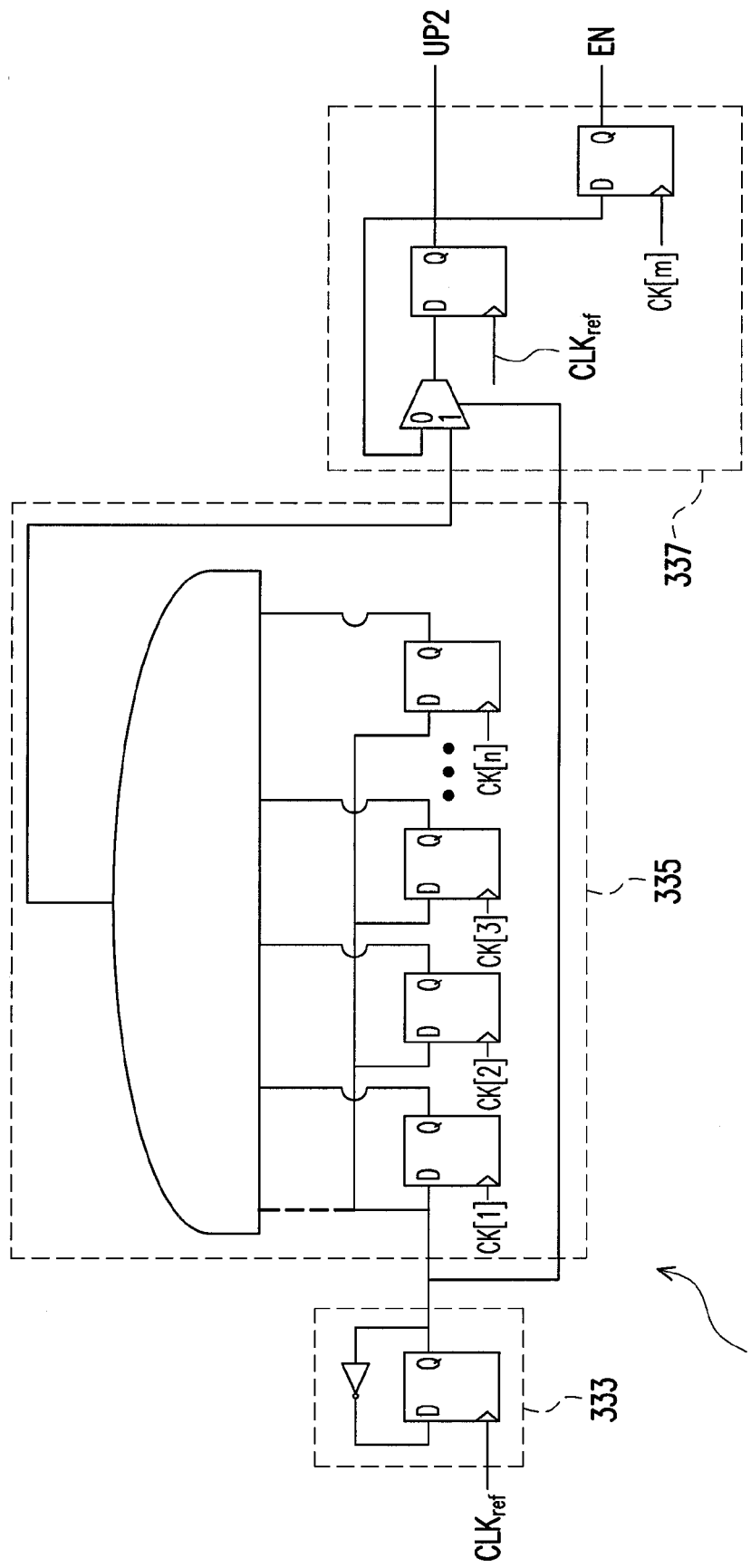
FIG. 17 shows a phase limiter according to an embodiment of the invention.

One embodiment of the phase limiter 332 complying with the foregoing requirements is implemented as shown in FIG. 17.

FIG. 17 shows a phase limiter according to an embodiment of the invention. Referring to FIG. 17, in the present embodiment, the phase limiter 332 includes a frequency divider 333, a logic signal generation unit 335 and an initiation signal generation unit 337.

In the present embodiment, the frequency divider 333 is used to receive the input clock signal $CLK_{ref}$ and to divide the input clock signal $CLK_{ref}$ to generate a divided input clock signal. Herein, the frequency divider 333, for example, includes a D flip flop, wherein an inverter is coupled between its D end and Q end.

The logic signal generation unit 335 is used to receive the divided input clock signal and the clock phases CK[1]~CK[n] outputted by the $1^{st}$ to the $N^{th}$ delay cells to output a logic high signal (not shown) to the initiation signal generation unit 337. Herein, n must be greater than 8.

Herein, the logic signal generation unit 335, for example, includes N D flip flops and an AND gate, whose CLK ends respectively receive the clock phases CK[1]~CK[n] outputted by the $1^{st}$ to the $N^{th}$ delay cells, and the Q end thereof is coupled to the input of the AND gate.

It should be noted that in the logic signal generation unit 335, the signal path coupled to the input of the AND gate and shown by dash lines means that coupling of the signal path is optional. The signal path can be used to reset the AND gate of the logic signal generation unit 335.

The initiation signal generation unit 337 is used to receive the input clock signal $CLK_{ref}$ which has not been divided, the clock phase CK[m] outputted by the $M^{th}$ delay cell, and the logic high signal. Thus, the initiation signal generation unit 337 outputs the logic high signal to serve as the up signal UP2 according to the input clock signal $CLK_{ref}$ and the clock phase CK[m]. Furthermore, the initiation signal generation unit 337 also outputs the initiation signal EN to enable the phase frequency detecting loop, wherein M is a positive integer. Herein, the initiation signal generation unit 337, for example, includes two D flip flops and a selector. When the divided input clock signal $CLK_{ref}$ is high, the selector selects the logic high signal from the logic signal generation unit 335 to be output.

Thus, In the exemplary embodiments of the invention, if the voltage control delay line includes L delay cells connected in serial, then L, M, and N satisfy the following conditions: M<N and L−N<M<L, wherein L is a positive integer greater than M and N.

Figure 18:
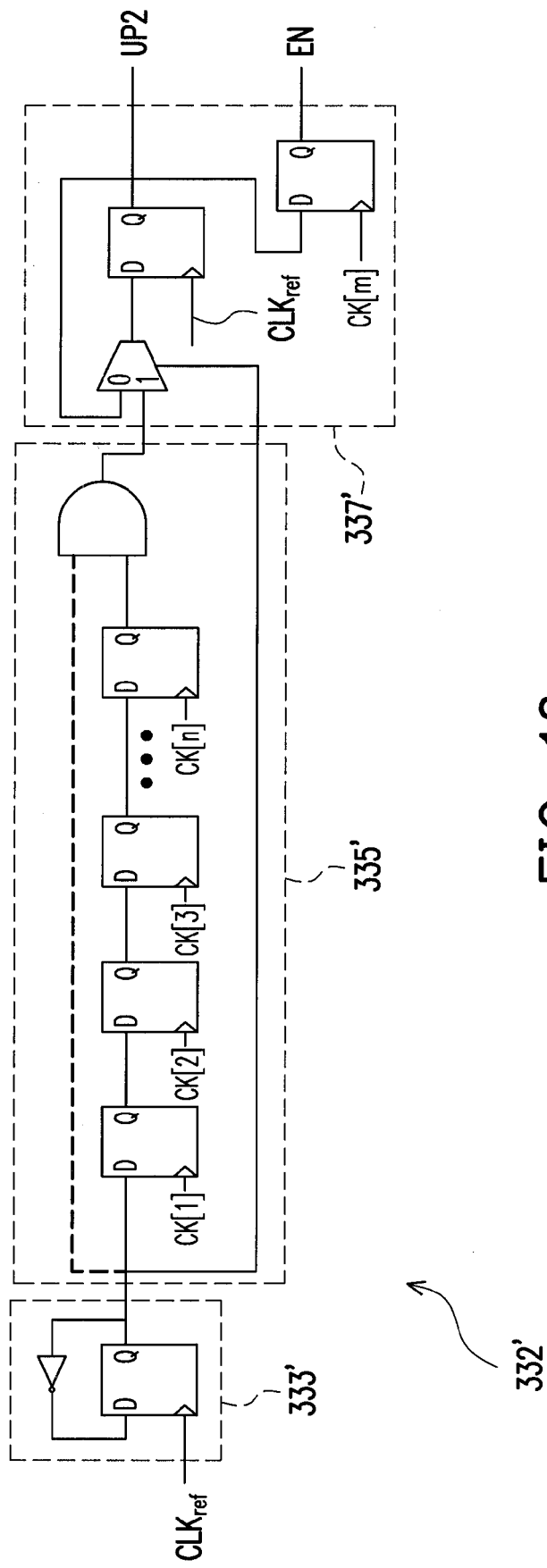
FIG. 18 shows a phase limiter according to another embodiment of the invention.

FIG. 18 shows a phase limiter according to another embodiment of the invention. Referring to FIG. 18, the phase limiter 332' of the present embodiment is analogous to the phase limiter 332. The main difference therebetween, for example, lies in the configuration of the D flip flops and the AND gate of the logic signal generation unit 335'.

To be specific, in the present embodiment, the D end of the first D flip flop of the logic signal generation unit 335' receives the divided clock signal $CLK_{ref}$, whereas its Q end is coupled to the D end of the next D flip flop, and so on. The Q end of the last D flip flop of the logic signal generation unit 335' is coupled to the input of the AND gate.

Likewise, in the logic signal generation unit 335', the signal path coupled to the input of the AND gate and shown by dash lines means that coupling of the signal path is optional. The signal path can be used to reset the AND gate of the logic signal generation unit 335'.

Figure 19:
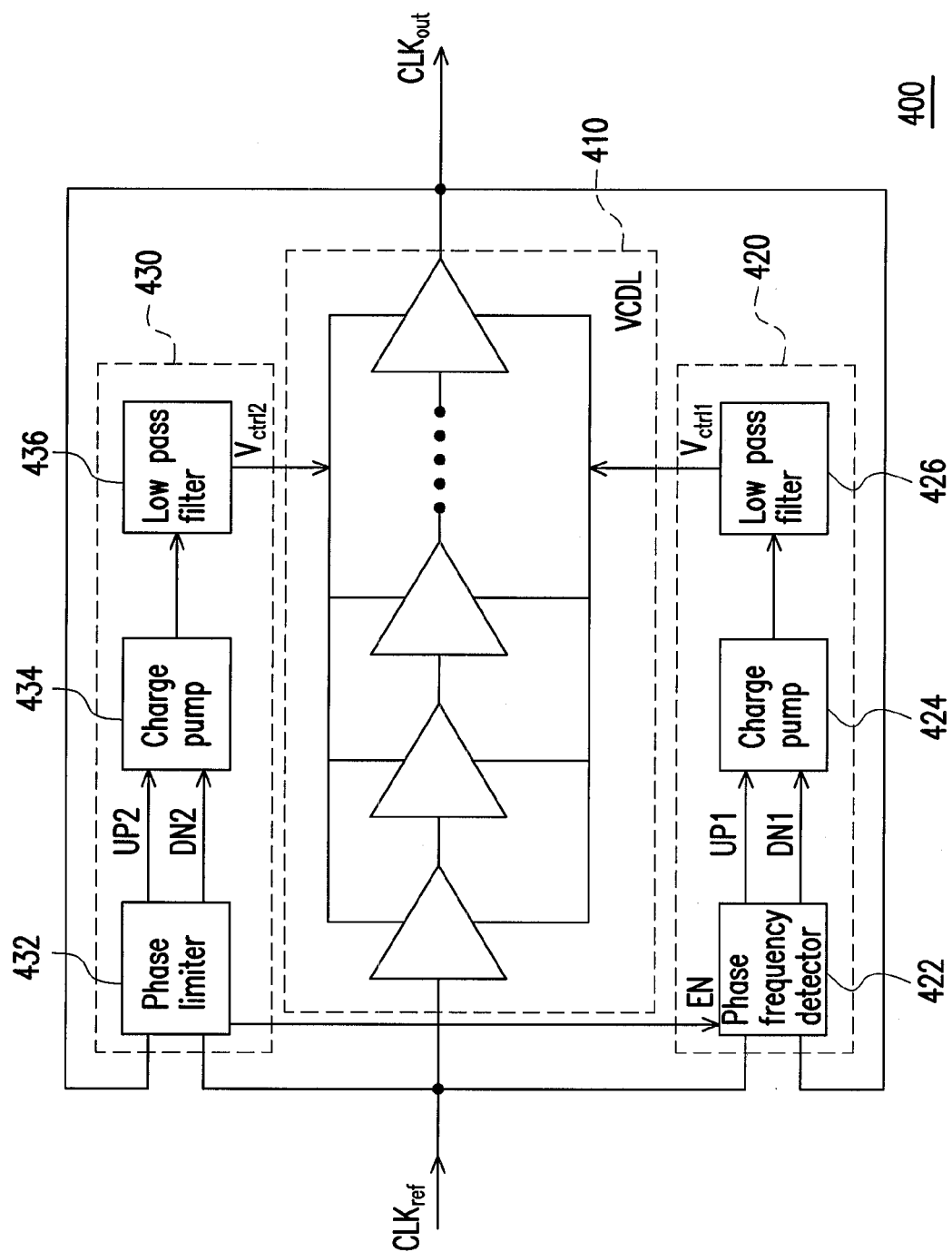
FIG. 19 illustrates a delay lock loop according to another embodiment of the invention.

FIG. 19 illustrates a delay lock loop according to another embodiment of the invention. Referring to FIG. 19, in the present embodiment, a delay lock loop 400 includes a voltage control delay line 410, a phase frequency detecting loop 420, and a phase limiting loop 430. Herein, the phase frequency detecting loop 420 includes a phase frequency detector 422, a charge pump 424, and a low pass filter 426. The phase limiting loop 430 includes a phase limiter 432, a charge pump 434 and a low pass filter 436.

Thus, the main difference between the delay lock loop 400 of the present embodiment and the delay lock loop 300 of FIG. 12, for example, lies in that the phase limiting loop 430 does not share the charge pump and the low pass filter with the phase frequency detecting loop 420.

Consequently, in the present embodiment, the phase limiting loop 430 restricts the output clock signal $CLK_{out}$ to be less than a delay time $T_{dL1}$ through the DC voltage signal $V_{ctrl2}$ or restricts the output clock signal $CLK_{out}$ to be greater than a delay time $T_{dL2}$ through the DC voltage signal $V_{ctrl2}$.

On the other hand, identical or similar features of the delay lock loops 400 and 300 can be sufficiently taught, suggested, and embodied in the descriptions with reference to FIGS. 12 to FIG. 18, and therefore no further description is provided herein.

Figure 20:
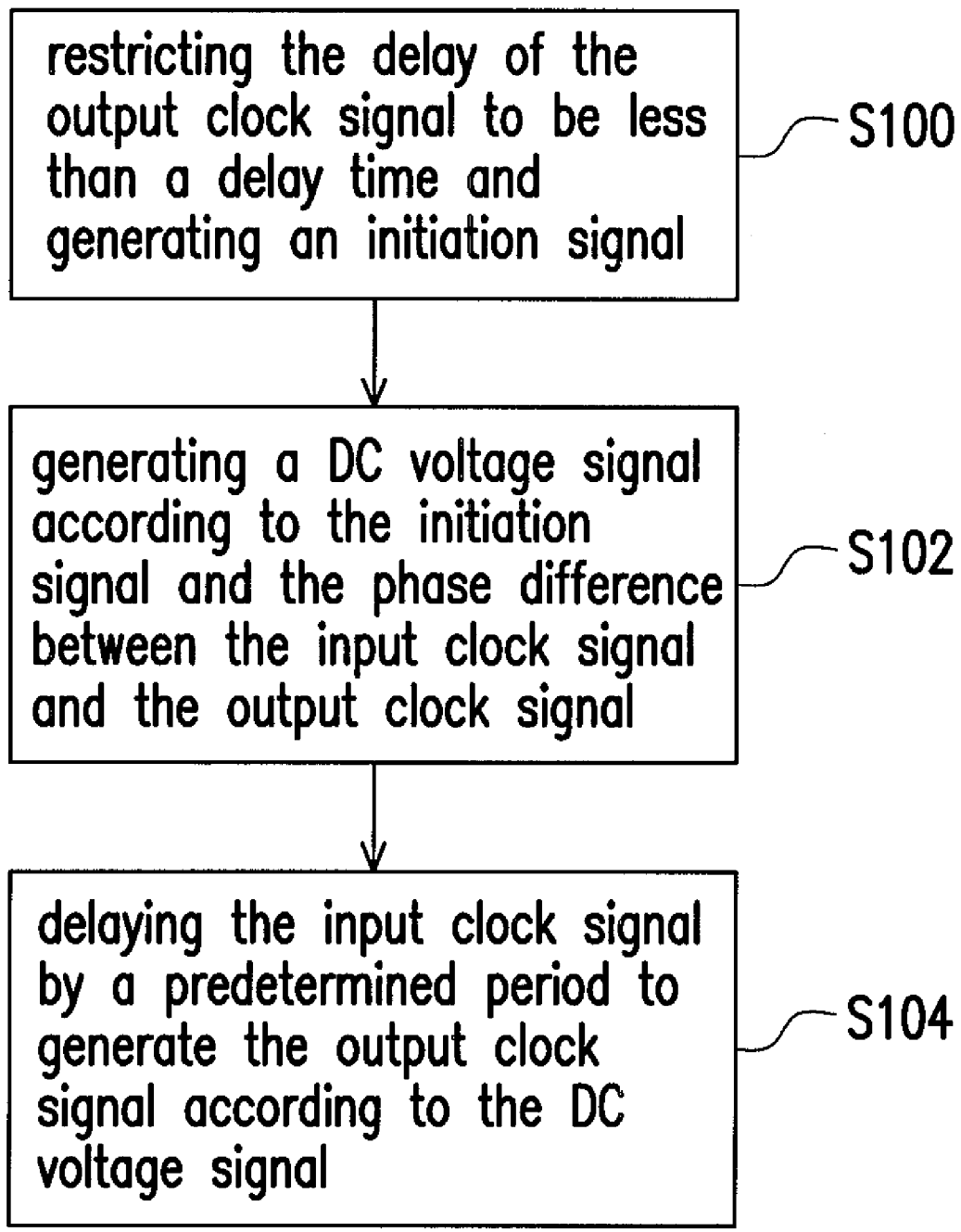
FIG. 20 is a flowchart illustrating the method for generating a clock signal according to an embodiment of the invention.

FIG. 20 is a flowchart illustrating the method for generating a clock signal according to an embodiment of the invention. Referring to FIGS. 12 and 20, the method for generating a clock signal is adapted to, for example, the delay lock loop shown in FIG. 12 or FIG. 19 and thereof includes the following steps. First, in step S100, the delay of the output clock signal $CLK_{out}$ is restricted to be less than a delay time, and an initiation signal EN is generated. Next, in step S102, a DC voltage signal $V_{ctrl1}$ is generated according to the initiation signal EN and the phase difference between the input clock signal $CLK_{ref}$ and the output clock signal $CLK_{out}$. Thereafter, the input clock signal $CLK_{ref}$ is delayed by a predetermined period to generate the output clock signal $CLK_{out}$ according to the DC voltage signal $V_{ctrl1}$.

Besides, the method for generating a clock signal described in this embodiment of the invention is sufficiently taught, suggested, and embodied in the embodiments illustrated in FIGS. 7 to FIG. 19, and therefore no further description is provided herein.

In summary, in the exemplary embodiments of the invention, the phase limiting loop can control the initial states of the phase frequency detecting loop such that phase detection can be performed at appropriate timings, and the erroneous phase detection by the phase frequency detecting loop, due to a poor duty cycle of the output clock signal generated by the delay lock loop, can be avoided.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A delay lock loop, comprising:
   a voltage control delay line receiving an input clock signal and a first DC voltage signal and generating an output clock signal according to the first DC voltage signal, wherein the voltage control delay line delays the input clock signal by a predetermined period to generate the output clock signal;
   a phase frequency detecting loop receiving the input clock signal, the output clock signal, and an initiation signal, generating the first DC voltage signal according to a phase difference of the input clock signal and the output clock signal, and being controlled by the initiation signal; and
   a phase limiting loop receiving the input clock signal and the output clock signal, restricting a delay of the output clock signal to be less than a first delay time, and generating the initiation signal to enable the phase frequency detecting loop.

2. The delay lock loop as claimed in claim 1, wherein the voltage control delay line comprises a plurality of delay cells, and each of the delay cells respectively delays the input clock signal by one clock phase.

3. The delay lock loop as claimed in claim 2, wherein the phase frequency detecting loop comprises:
   a phase frequency detector receiving the input clock signal, the output clock signal, and the initiation signal, generating a first up signal and a first down signal according to the phase difference of the input clock signal and the output clock signal, and being controlled by the initiation signal;
   a first charge pump receiving the first up signal or the first down signal and generating a first current signal according to the first up signal or the first down signal; and
   a first low pass filter receiving the first current signal from the first charge pump to generate the first DC voltage signal.

4. The delay lock loop as claimed in claim 3, wherein the phase limiting loop comprises:
   a phase limiter receiving the input clock signal and the output clock signal, generating a second up signal according to the phase difference of the input clock signal and the output clock signal to restrict the delay of the output clock signal to be less than the first delay time, and generating the initiation signal, wherein the first charge pump further receives the second up signal and generates the first current signal according to the first up signal, the first down signal, and the second up signal.

5. The delay lock loop as claimed in claim 4, wherein the phase limiter further generates a second down signal according to the phase difference of the input clock signal and the output clock signal to restrict the delay of the output clock signal to be greater than a second delay time, wherein the first charge pump further receives the second down signal and generates the first current signal according to the first up signal, the first down signal, the second up signal, or the second down signal.

6. The delay lock loop as claimed in claim 4, wherein the phase limiter comprises:
   a frequency divider receiving the input clock signal and dividing the input clock signal to generate the divided input clock signal;
   a logic signal generation unit receiving the divided input clock signal and the clock phases outputted by the N delay cells to output a logic high signal; and
   a initiation signal generation unit receiving the input clock signal, the clock phase outputted by the $M^{th}$ delay cell, and the logic high signal, outputting the logic high signal as the second up signal according to the input clock signal and the clock phase outputted by the $M^{th}$ delay cell, and outputting the initiation signal to enable the phase frequency detecting loop, wherein M and N are positive integers.

7. The delay lock loop as claimed in claim 6, the voltage control delay line comprises L delay cells connected in series, wherein L, M, and N satisfy the following conditions: M<N and L−N<M<L, L is a positive integer, and L is greater than M and N.

8. The delay lock loop as claimed in claim 3, wherein the phase limiting loop comprises:
   a phase limiter receiving the input clock signal and the output signal and generating a second up signal according to the phase difference of the input clock signal and the output clock signal;
   a second charge pump receiving the second up signal and generating a second current signal according to the second up signal; and
   a second low pass filter receiving the second current signal from the second charge pump and generating a second DC voltage signal, wherein the phase limiter restricts the delay of the output clock signal to be less than the first delay time by the second DC voltage signal.

9. The delay lock loop as claimed in claim 8, wherein the phase limiter further generates a second down signal according to the phase difference of the input clock signal and the output clock signal to restrict the delay of the output clock signal to be greater than a second delay time, wherein the second charge pump further receives the second down signal and generates the second current signal according to the second up signal or the second down signal, wherein the phase limiter restricts the delay of the output clock signal to be greater than the second delay time by the second DC voltage signal.

10. The delay lock loop as claimed in claim 8, wherein the phase limiter comprises:

a frequency divider receiving the input clock signal and dividing the input clock signal to generate the divided input clock signal;

a logic signal generation unit receiving the divided input clock signal and the clock phases outputted by the N delay cells to output a logic high signal; and an initiation signal generation unit receiving the input clock signal, the clock phase outputted by the $M^{th}$ delay cell, and the logic high signal, outputting the logic high signal as the second up signal according to the input clock signal and the clock phase outputted by the $M^{th}$ delay cell, and outputting the initiation signal to enable the phase frequency detecting loop, wherein M and N are positive integers.

11. The delay lock loop as claimed in claim 10, the voltage control delay line comprises L delay cells connected in series, wherein L, M, and N satisfy the following conditions: M<N and L−N<M<L, L is a positive integer, and L is greater than M and N.

12. A method for generating a clock signal, adapted to a delay lock loop, wherein the delay lock loop delays an input clock signal by a predetermined period and generates an output clock signal, the method comprises:

restricting a delay of the output clock signal to be less than a first delay time and generating an initiation signal;

generating a first DC voltage signal according to the initiation signal and a phase difference between the input clock signal and the output clock signal; and delaying the input clock signal by the predetermined period to generate the output clock signal according to the first DC voltage signal.

13. The method for generating the clock signal as claimed in claim 12, wherein the step of generating the first DC voltage signal comprises:

generating a first up signal or a first down signal according to the initiation signal and the phase difference between the input clock signal and the output clock signal;

generating a first current signal according to the first up signal or the first down signal; and generating the first DC voltage signal according to the first current signal.

14. The method for generating the clock signal as claimed in claim 13, wherein the step of restricting the delay of the output clock signal to be less than the first delay time comprises:

generating a second up signal according to the phase difference between the input clock signal and the output clock signal to restrict the delay of the output clock signal to be less than the first delay time, wherein in the step of generating the first current signal, the first current signal is generated according to the first up signal, the first down signal, or the second up signal.

15. The method for generating the clock signal as claimed in claim 14, further comprising:

restricting the delay of the output clock signal to be greater than a second delay time.

16. The method for generating the clock signal as claimed in claim 15, wherein the step of restricting the delay of the output clock signal to be greater than the second delay time comprises:

generating a second down signal according to the phase difference between the input clock signal and the output clock signal to restrict the delay of the output clock signal to be greater than the second delay time, wherein in the step of generating the first current signal, the first current signal is generated according to the first up signal, the first down signal, the second up signal, or the second down signal.

17. The method for generating the clock signal as claimed in claim 15, wherein the step of restricting the delay of the output clock signal to be less than the first delay time comprises:

generating a second up signal according to the phase difference between the input clock signal and the output clock signal;

generating a second current signal according to the second up signal; and generating a second DC voltage signal according to the second current signal, wherein in the step of restricting the delay of the output clock signal to be less than the first delay time, the delay of the output clock signal is restricted to be less than the first delay time by the second DC voltage signal.

18. The method for generating the clock signal as claimed in claim 17, wherein the step of restricting the delay of the output clock signal to be greater than the second delay time comprises:

generating a second down signal according to the phase difference between the input clock signal and the output clock signal to restrict the delay of the output clock signal to be greater than the second delay time, wherein in the step of generating the second current signal, the second current signal is generated according to the second up signal or the second down signal, and in the step of restricting the delay of the output clock signal to be greater than the second delay time, the delay of the output clock signal is restricted to be greater than the second delay time by the second DC voltage signal.

* * * * *